(12) United States Patent
Chang

(10) Patent No.: US 6,475,030 B1
(45) Date of Patent: Nov. 5, 2002

(54) HEAT SINK FASTENER

(75) Inventor: Kuang-Ming Chang, I-Lan Hsien (TW)

(73) Assignee: Tsun-I Enterprise Co., Ltd., Taipei Hsien (TW)

( * ) Notice: Subject to any disclaimer, the term of this patent is extended or adjusted under 35 U.S.C. 154(b) by 0 days.

(21) Appl. No.: 10/159,133

(22) Filed: May 30, 2002

(30) Foreign Application Priority Data

Apr. 15, 2002 (TW) .................................... 91205030 U

(51) Int. Cl.[7] .............................................. H01R 13/73
(52) U.S. Cl. ...................... 439/557; 439/485; 411/503; 411/512; 411/513
(58) Field of Search ................................ 411/508, 509, 411/913, 512, 338, 339, 352, 353; 439/557, 485, 487

(56) References Cited

U.S. PATENT DOCUMENTS 5,791,850 A * 8/1998 Mundt et al. .................. 411/21
6,061,240 A * 5/2000 Butterbaugh et al. ...... 165/80.2
6,334,750 B1 * 1/2002 Hsieh .......................... 165/80.3
6,364,344 B2 * 4/2002 Hudd et al. .............. 200/61.55
6,364,688 B1 * 4/2002 Fraley et al. ................ 411/353
6,409,446 B1 * 6/2002 Schwarz ...................... 411/353

* cited by examiner

Primary Examiner—Gary Paumen
Assistant Examiner—James R. Harvey
(74) Attorney, Agent, or Firm—William E. Pelton, Esq.

(57) ABSTRACT

A heat sink fastener is applied to fasten a heat sink contacted with an electrical element mounted on a substrate. The heat sink fastener has a pillar integrally formed by an upper segment and a lower segment that further has an arrowhead hook, a coil spring winded around the pillar, and a cannular column with two openings for receiving the pillar. A step is formed around the first opening defined at one end of the column, and the second opening is defined at the other end of the column to allow the lower segment and the hook to pass through. When heat sink fastener is applied to fasten the heat sink to the substrate, the column is pressed downward to the heat sink, and the hook is inserted through the heat sink and the substrate to be tightly and upwardly pressed against the bottom of the substrate.

2 Claims, 6 Drawing Sheets

HEAT SINK FASTENER

BACKGROUND OF THE INVENTION

1. Field of Invention

The present invention relates to a heat sink fastener, and more particularly to a fastener that is easy to equip to an IC heat sink and has the advantages of long use life.

2. Related Art

Based on the unceasing development of the scientific techniques, many helpful electrical products are used to improve our lives, wherein currently the computer and its peripheral instruments bring the most significant effects to people. A CPU, the main core of a computer and vital for data processing, computation, etc. generally generates a quantity of heat much greater than other components. Thus how to quickly and effectively dissipate the heat to prevent the CPU from experiencing heat damage is of major importance in this field. Therefore, the heat sink for heat dissipation is applied on the CPU.

Conventionally, the heat sink is made of metal material with good heat conductivity and is mounted on the surface of the CPU, whereby the heat generated from CPU is conducted to the heat sink. Usually, the heat is further dissipated to air by a cooling fan (not shown) mounted above the heat sink. To avoid the heat sink falling from the CPU, heat sink fasteners are applied to secure the heat sink on the CPU.

With reference to FIG. 5, a conventional fastener (50) for a heat sink (not numbered) comprises a flat portion (51) and a leg portion (52) integrally and downwardly formed along a flange of the flat portion (51). The free end of the leg portion (52) is integrally formed with a rib (not numbered) parallel to the flat portion (51), whereby the lateral view of the fastener (50) is a substantially Γ shape. The distance between the flat portion (51) and the free end of the leg portion (52) is corresponded to the total thickness of the heat sink, the IC and the IC socket. When the fastener (50) is applied to the heat sink, the flat portion (51) is slipped into a groove defined in the heat sink, and the leg portion (52) together with the rib will collectively clip the heat sink, the IC and the IC socket.

However, for an operator, such a fastener (50) is not convenient to equip to the heat sink since the fastener (50) easily falls from the heat sink.

With reference to FIG. 6, another conventional type of the fastener (60) has the structure like a screw. The fastener (60) comprises a head portion (62), a pillar (61) lengthwise extending from the head portion (62), a spring (64) winded around the pillar (61) and a hook (63) integrally formed at the free end of the pillar (61). To assemble the fastener (60) to the heat sink (65), the pillar (61) is inserted into a through hole (67) defined in a wing (66) extending from the heat sink (65). The pillar (61) further extends into an opening (69) defined in the substrate (68), whereby the hook (63) is secured to the bottom surface of the substrate (68) to make the heat sink (65) tightly contact with the CPU (not numbered).

However, if the pressing force applied to the fastener (60) is not uniform when the fastener is installed to the heat sink (65), the pillar (61) is easy to deform or snap.

To overcome the shortcomings, a heat sink fastener in accordance with the present invention obviates or mitigates the aforementioned problems.

SUMMARY OF THE INVENTION

The primary objective of the present invention is to provide a fastener that is easy to equip to a heat sink and tightly secures the heat sink to a substrate on which an electrical component contacted with the heat sink is mounted.

Other objectives, advantages and novel features of the invention will become more apparent from the following detailed description when taken in conjunction with the accompanying drawings.

DETAILED DESCRIPTION OF THE INVENTION

Figure 1:
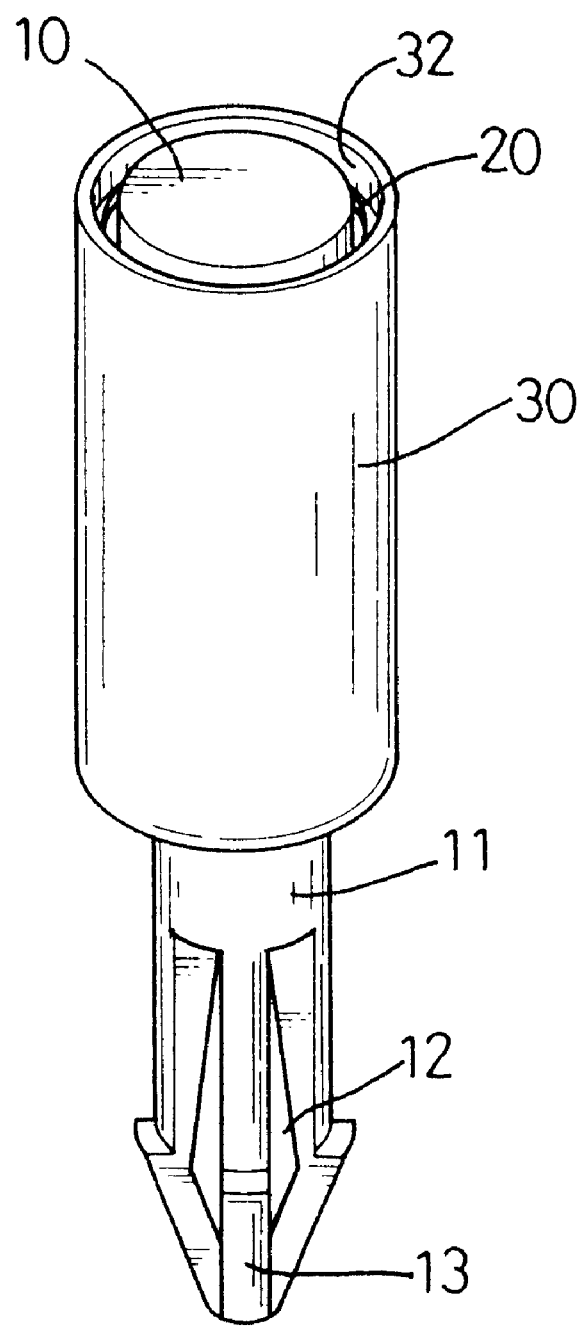
FIG. 1 is a perspective view of a heat sink fastener in accordance with the present invention.
Figure 2:
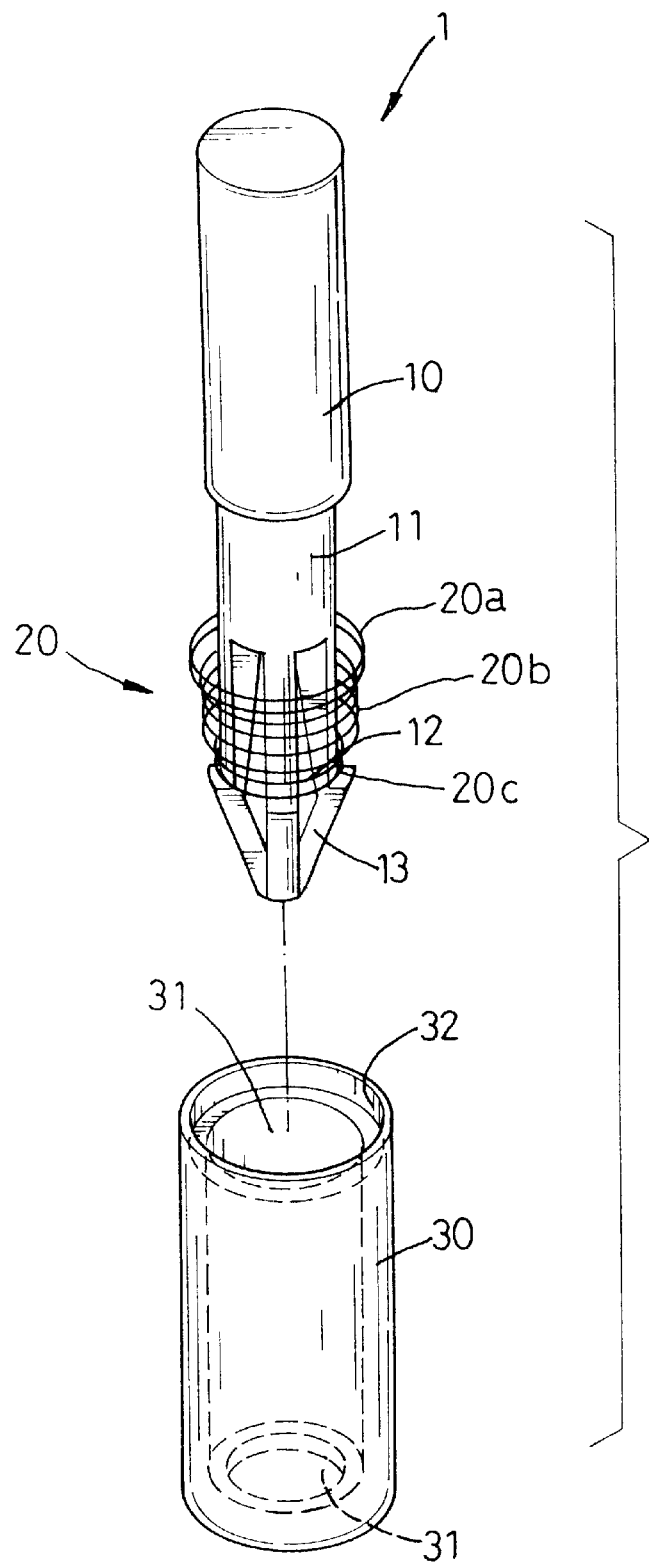
FIG. 2 is an exploded perspective view of the fastener of FIG. 1.

With reference to FIGS. 1 and 2, a heat sink fastener in accordance with the present invention mainly comprises a pillar (1), a tapered coiled spring (20) winded around the pillar (1) and a column (30). The pillar (1) has an upper segment (10), a lower segment (11) integrally extending downward from the upper segment (10), wherein the diameter of the lower segment (11) is smaller than that of the upper segment (10). An arrowhead hook (13) defined with a cannular space (12) in its center is integrally formed and extending from a free end of the lower segment (11).

A through channel with two openings (31)(33) is defined in the column (30), wherein a step (32) is formed around the inner surface of the channel defining the first opening (31). The first opening (31) allows the upper segment (10) to be inserted into the channel. The second opening (33) is smaller than the first opening (31) and is corresponded to the lower segment (11) of the pillar (1).

The coiled spring (20) is formed to be a substantially step shaped with three parts, an upper part (20a), a middle part (20b) and a lower part (20c). The upper part (20a) of the spring (20) has the largest diameter among that of the three parts, and the lower part (20c) of the spring (20) has the smallest diameter.

After the coiled spring (20) is twisted around the pillar (1) and the pillar (1) is inserted into the channel of the column (30), the lower segment (11) of the pillar (1) with the arrowhead hook (13) extend through the second opening (33). Since the diameter of the upper segment (10) is bigger than that of the second opening (33), the upper segment (10) is received inside the column (30).

Figure 3:
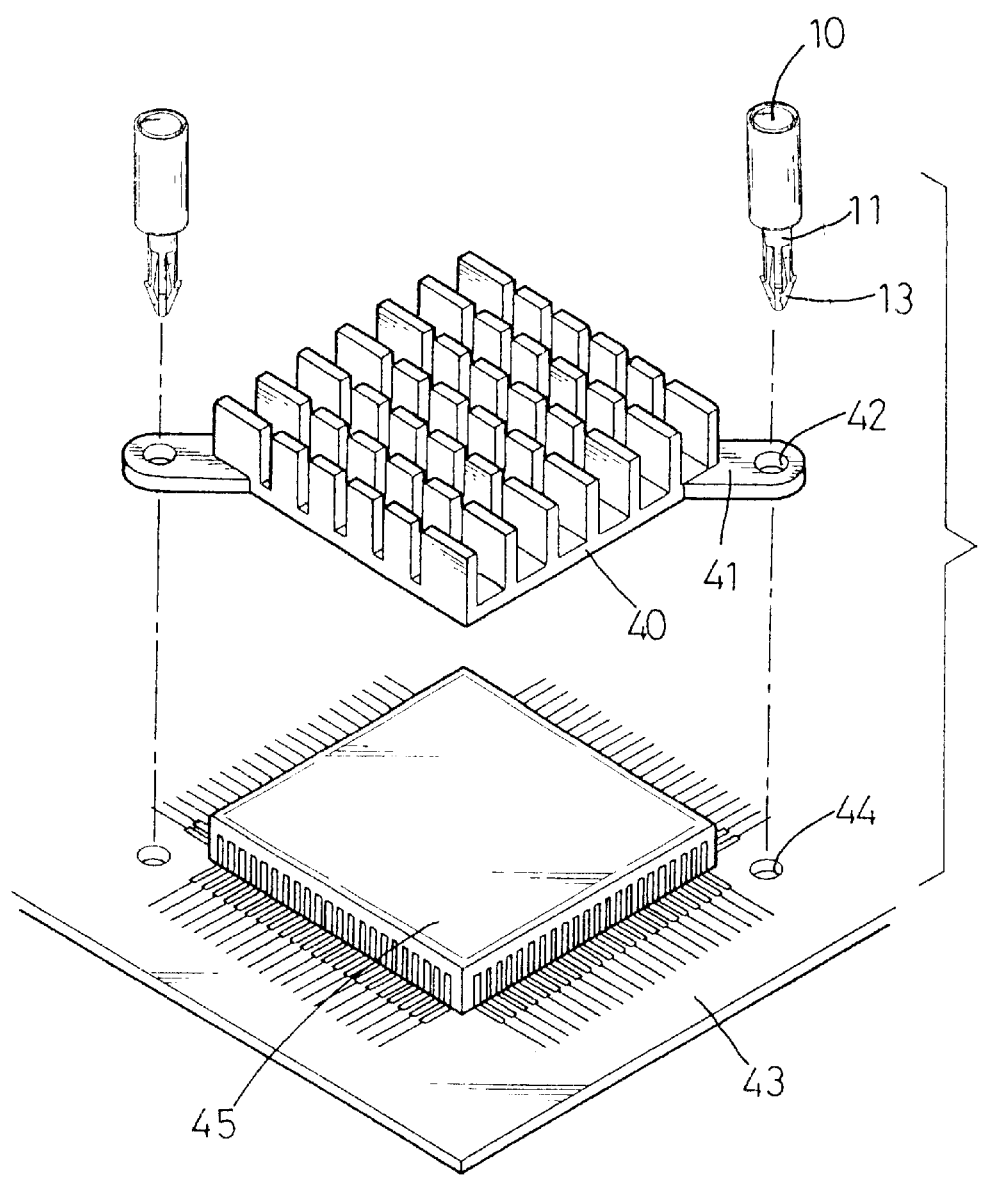
FIG. 3 is an operation view showing how the fasteners of FIG. 1 are equipped to a heat sink.
Figure 4:
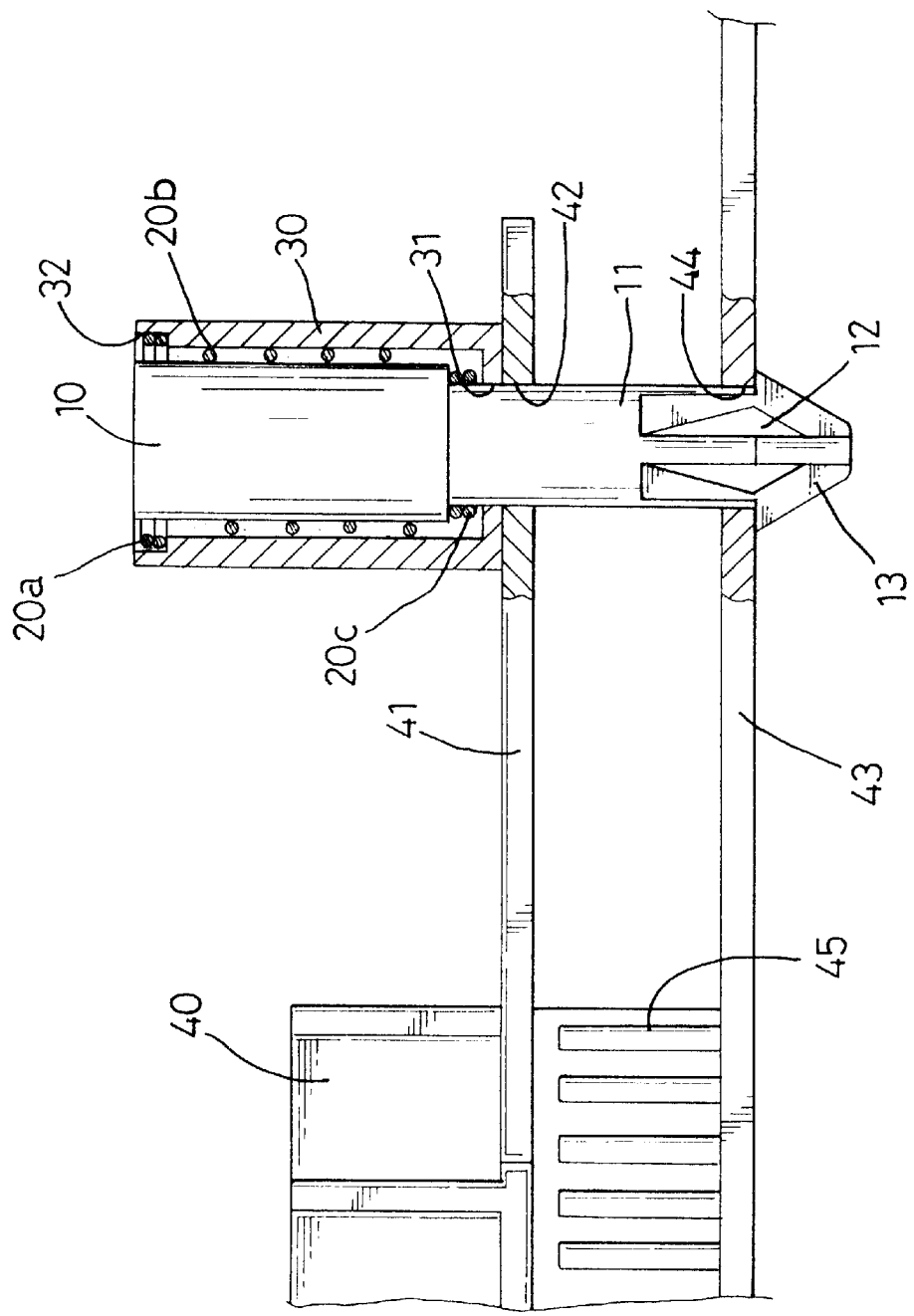
FIG. 4 is a partial cross-sectional view of the fastener that is equipped to the heat sink.
Figure 5:
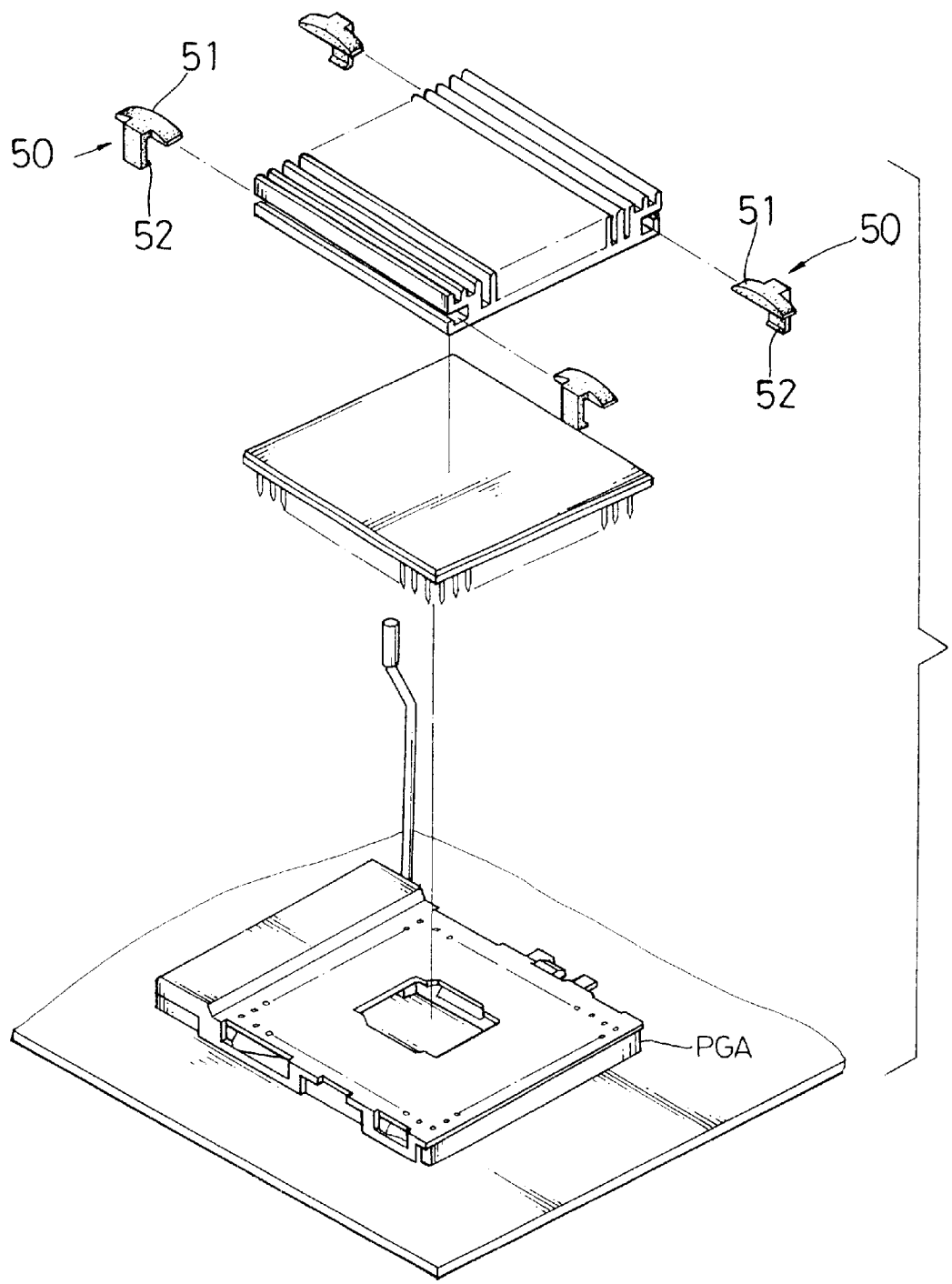
FIG. 5 is an operation view showing how a first conventional fastener is equipped to a heat sink.
Figure 6:
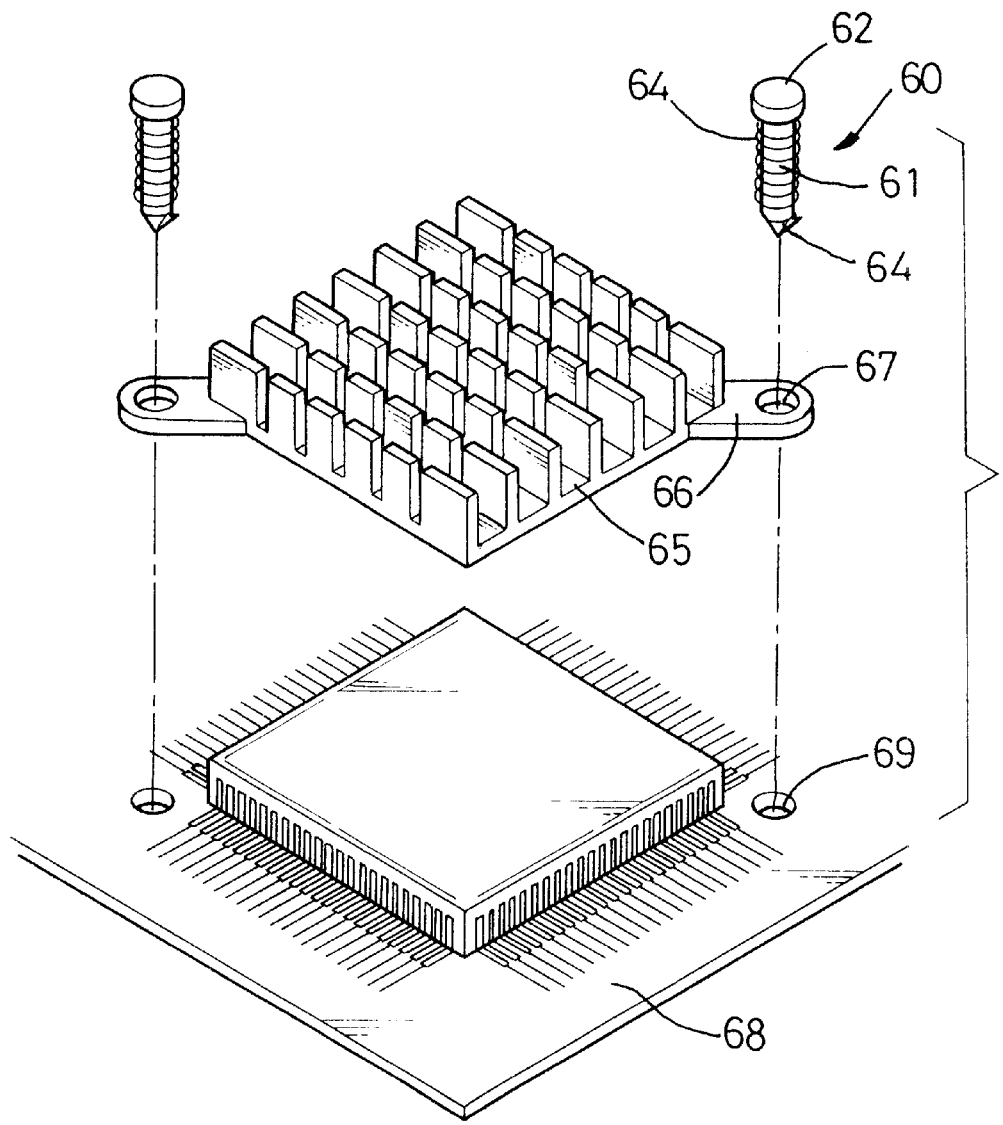
FIG. 6 is an operation view showing how a second conventional fastener is equipped to a heat sink.

With reference to FIGS. 3 and 4, when the fastener in accordance with the present invention is applied to fasten a heat sink (40) to a substrate (43) on which an electrical element (45), such as a CPU, is mounted, the lower segment (11) together with the arrowhead hook (13) are sequentially inserted into a hole (42) defined in a wing (41) extending from the heat sink (40) and an opening (44) defined in the substrate (43). The column (30) is retained on the wing (41) of the heat sink (40). Since the arrowhead hook (13) has a cannular space (12) defined in its center, the cannular space

(12) allows the arrowhead hook (13) to slightly deform and shrink to pass through the hole (42) and opening (44). When the arrowhead hook (13) extends out the opening (44), the arrowhead hook (13) is tightly pressed against the bottom surface of the substrate (43).

With reference to FIG. 4, the diameter of the upper part (20a) of the spring (20) is bigger than that of the first opening (31) but slightly smaller than that of the circular step (32). Further, the diameter of the lower part (20c) of the spring (20) is bigger than that of the lower segment (11) but smaller than that of the upper segment (10). Therefore, when the fastener is installed to the heat sink (40) and the spring (20) is expanded lengthwise, the lower part (20c) is surrounded around the lower segment (11) and upwardly presses against the upper segment (10) because of the resilience of the spring (20). Meanwhile, the upper part (20a) of the spring (20) downwardly presses against the circular step (32) to make the column (30) tightly and downwardly contact with the wing (41) of the heat sink (40), whereby the heat sink (40) is tightly contacted with the electrical element (45).

The invention may be varied in many ways by a skilled person in the art. Such variations are not to be regarded as a departure from the spirit and scope of the invention, and all such modifications are intended to be included within the scope of the following claims.

What is claimed is:

1. A heat sink fastener for fastening a heat sink contacted with an electrical element that is mounted on a substrate, the heat sink fastener comprising:

a pillar formed by an upper segment and a lower segment extending from one end of the upper segment, wherein the lower segment has a diameter smaller than that of the upper segment, and an arrowhead hook in which a cannular space is defined extends integrally from a free end of the lower segment, wherein the cannular space allows the arrowhead hook to slightly deform and shrink;

a column defined with a through channel that has a first opening and a second opening, wherein a step is formed around an inner surface of the channel defining the first opening, and the second opening is smaller than the first opening;

wherein when the pillar is inserted into the through channel, the upper segment is received inside the channel, and the lower segment together with the arrowhead hook extend through the second opening to adapt to pass through the heat sink and the substrate, whereby the arrowhead hook is able to be upwardly pressed against a bottom surface of the substrate;

a coiled spring winded around the pillar, wherein when the arrowhead hook is upwardly pressed against the bottom surface of the substrate, an upper part of the coiled spring is received in the step and pressed downward against the step to make the column contact with the heat sink, wherein a lower part of the coiled spring is upwardly pressed against the upper segment of the pillar.

2. The fastener as claimed in claim 1, wherein a diameter of the second opening is bigger than that of the shrank arrowhead hook, whereby the arrowhead hook is able to go through the second opening when the lower segment of the pillar together with the arrowhead hook are inserted through the second opening.

* * * * *